(12) United States Patent
Owechko

(10) Patent No.: US 11,676,367 B1
(45) Date of Patent: Jun. 13, 2023

(54) SYSTEM AND METHOD FOR ANOMALY DETECTION USING ANOMALY CUEING

(71) Applicant: HRL Laboratories, LLC, Malibu, CA (US)

(72) Inventor: Yuri Owechko, Newbury Park, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 881 days.

(21) Appl. No.: 16/684,458

(22) Filed: Nov. 14, 2019

Related U.S. Application Data

(60) Provisional application No. 62/802,438, filed on Feb. 7, 2019.

(51) Int. Cl.
| | |
|---|---|
| *G06V 10/75* | (2022.01) |
| *H03H 21/00* | (2006.01) |
| *G06T 7/90* | (2017.01) |
| *G06T 7/62* | (2017.01) |
| *G06F 18/23* | (2023.01) |

(52) U.S. Cl.
CPC .............. *G06V 10/751* (2022.01); *G06T 7/62* (2017.01); *G06T 7/90* (2017.01); *H03H 21/0025* (2013.01); *G06F 18/23* (2023.01); *G06F 2218/08* (2023.01); *H03H 2021/0034* (2013.01)

(58) Field of Classification Search
CPC ........... G06V 10/751; G06T 7/62; G06T 7/90; H03H 21/0025; H03H 2021/0034; G06F 18/23; G06F 2218/08
See application file for complete search history.

(56) References Cited

U.S. PATENT DOCUMENTS

| | | | |
|---|---|---|---|
| 8,761,506 B1 * | 6/2014 | Padwick | G06T 5/003 |
| | | | 382/167 |
| 9,299,010 B2 * | 3/2016 | Sathyendra | G01S 13/9064 |
| 10,234,377 B1 | 3/2019 | Owechko et al. | |
| 10,268,914 B1 | 4/2019 | Owechko | |
| 2016/0313184 A1 * | 10/2016 | Owechko | G01J 3/2823 |
| 2016/0328838 A1 * | 11/2016 | Kwan | G06V 20/13 |
| 2019/0035099 A1 * | 1/2019 | Ebrahimi Afrouzi | G06V 20/10 |
| 2019/0080210 A1 | 3/2019 | Owechko | |

* cited by examiner

*Primary Examiner* — Joseph J Dallo

(74) *Attorney, Agent, or Firm* — Tope-McKay & Associates

(57) ABSTRACT

Described a system for anomaly detection using anomaly cueing. In operation, an input image having two-dimensional (2D) image mixtures of primary components is reformatted into one-dimensional (1D) input signals. Blind source signal separation is used to separate the 1D input signals into separate output primary components, which are 1D output signals. The 1D output signals are reformatted into 2D spatially independent component output images. The system then calculates all possible pair product images of the 2D spatially independent component output images and corresponding signal-to-noise ratios. A pair product image is selected based on the peak signal-to-noise ratio and thresholded to identify anomalies in the pair product image. Several types of devices can then be controlled based on the identified anomalies in the pair product image.

24 Claims, 11 Drawing Sheets

100

SYSTEM AND METHOD FOR ANOMALY DETECTION USING ANOMALY CUEING

CROSS-REFERENCE TO RELATED APPLICATIONS

This application claims the benefit of and is a non-provisional patent application of U.S. 62/802,438, filed on Feb. 7, 2019, the entirety of which is hereby incorporated by reference.

GOVERNMENT RIGHTS

This invention was made with U. S. Government support. The government has certain rights in the invention.

BACKGROUND OF INVENTION

(1) Field of Invention

The present invention relates to an anomaly detection system and, more specifically, to a system and method for anomaly detection using an anomaly cuing process.

(2) Description of Related Art

Anomaly detection is a process by which some change in imagery occurs that is different in some characteristic such as color from the rest of the image that is then detected and used for object identification and/or tracking. Current methods for color or spectral anomaly detection in imagery require training with data, clustering of the pixels in the input image, or utilize prior knowledge. None of these existing methods can operate in real time on large images, nor do they quickly adapt to changing image statistics on a frame-by-frame basis without human assistance or learning from data.

Attempts have been made to address such challenges; for example, some methods have been proposed based on fitting multi-variate gaussians to the data. However, the gaussian assumption is often not accurate in many scenarios, which raises the false alarm rate. Methods based on various learning algorithms such as support vector machines, deep learning, and auto-encoding have also been proposed but these methods require large amounts of training data, are computationally complex, contain many adjustable parameters, and do not perform well if the training set is small or conditions change rapidly.

Thus, a continuing need exists for a relatively simple anomaly detection system that requires little memory, has a minimal number of adjustable parameters, does not require clustering or learning from data, is linearly scalable, and has very low false alarm rates.

SUMMARY OF INVENTION

This disclosure provides a system for anomaly detection using anomaly cueing. In various aspects, the system includes one or more processors and a memory. The memory is a non-transitory computer-readable medium having executable instructions encoded thereon, such that upon execution of the instructions, the one or more processors perform several operations, such as receiving an input image having two-dimensional (2D) image mixtures of primary components; reformatting the 2D image mixtures into one-dimensional (1D) input signals; using blind source signal separation, separating the 1D input signals into separate output primary components, the separate output primary components being 1D output signals; reforming the 1D output signals into 2D spatially independent component output images; calculating all possible pair product images of the 2D spatially independent component output images and corresponding signal-to-noise ratios; selecting a pair product image based on the peak signal-to-noise ratio; and thresholding the selected pair product image to identify anomalies in the pair product image.

In another aspect, the system performs an operation of controlling a device based on the anomalies.

In yet another aspect, the system performs an operation of monitoring image statistics of a next image frame to determine if the 2D image mixtures of primary components have changed from those of the input image, such that if the 2D image mixtures of primary components have not changed, then reusing a demixing matrix from a previous frame to demix the next image frame, otherwise performing anomaly detection on the next image frame to identify anomalies on the next image frame.

Additionally, the system performs an operation of using a subset of the input image to calculate a demixing matrix and then using the demixing matrix to demix the input image based on the subset of the input image.

In another aspect, the 2D image mixtures are formed of color, spectral, or polarimetric channels of image data.

In yet another aspect, the blind source signal separation is independent component analysis.

Further, the 2D image mixtures are reformatted into 1D input signals by concatenating rows and treating the 1D input signal as a mixture of image components for input to the blind source signal separation.

In yet another aspect, the pair product images have dimensions matching the input image such that locations of anomalies in the pair product images correspond directly to locations in the input image.

Finally, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
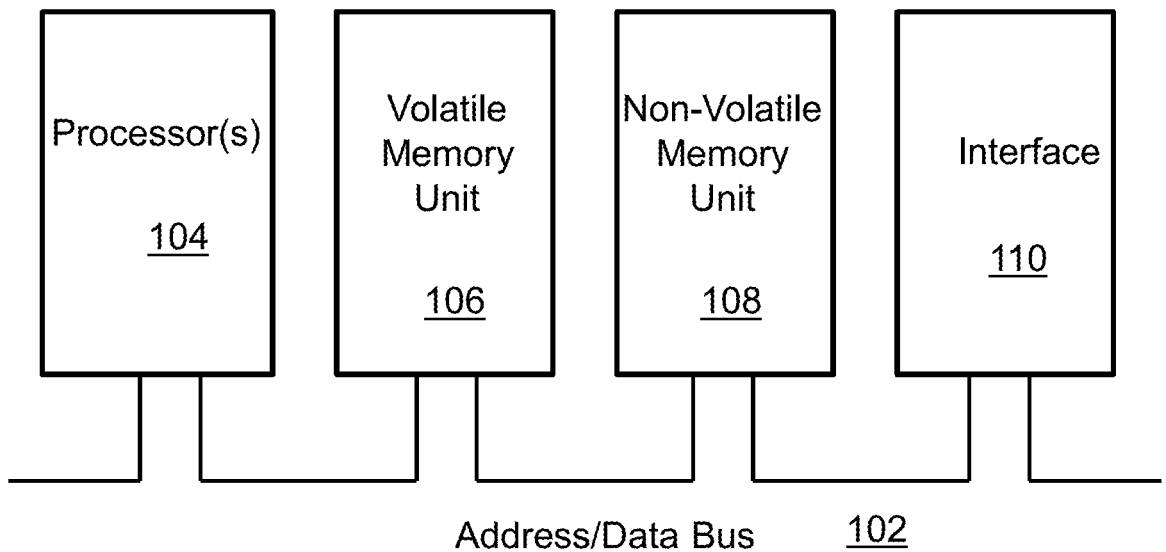
FIG. 1 is a block diagram depicting the components of a system according to various embodiments of the present invention.
Figure 1:
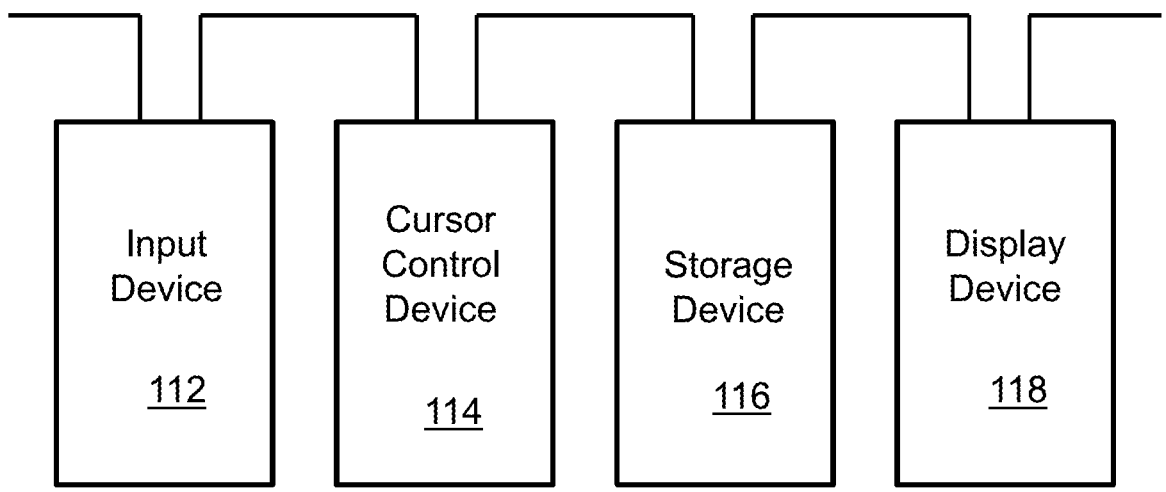

The present invention relates to an anomaly detection system and, more specifically, to a system and method for anomaly detection using an anomaly cuing process. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a description of the various principal aspects of the present invention is provided. Subsequently, an introduction provides the reader with a general understanding of the present invention. Finally, specific details of various embodiment of the present invention are provided to give an understanding of the specific aspects.

(1) Principal Aspects

Various embodiments of the invention include three "principal" aspects. The first is a system for anomaly detection. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein.

The computer system 100 may include an address/data bus 102 that is configured to communicate information. Additionally, one or more data processing units, such as a processor 104 (or processors), are coupled with the address/data bus 102. The processor 104 is configured to process information and instructions. In an aspect, the processor 104 is a microprocessor. Alternatively, the processor 104 may be a different type of processor such as a parallel processor, application-specific integrated circuit (ASIC), programmable logic array (PLA), complex programmable logic device (CPLD), or a field programmable gate array (FPGA).

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
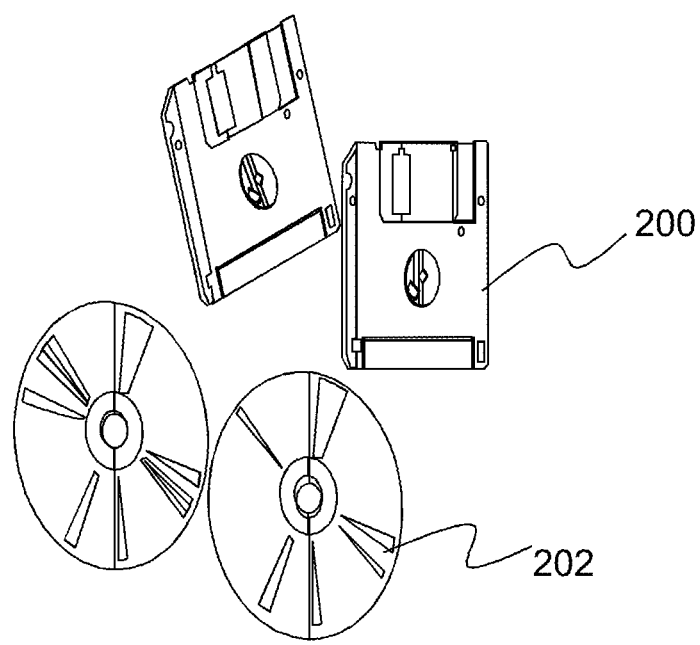
FIG. 2 is an illustration of a computer program product embodying an aspect of the present invention.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e. computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(2) Introduction

The present disclosure provides a system and method for anomaly detection using a unique "blind" sensing process for automatic detection of anomalies in color, multispectral, or polarimetric, imagery. The process uses the statistical independence of the primary regions in the image as defined by their color, spectral, or polarimetric distributions to detect anomalous pixels whose color, spectral, or polarimetric distribution is different from the primary regions. A unique approach based on forming products of the outputs of independent component analysis (ICA), selecting the product with the highest peak signal to noise ratio, and thresholding the product is used to detect anomalies without using prior knowledge, training of the algorithm, or user-adjustable parameters except for a sensitivity adjustment parameter. ICA is a well-known group of methods that can separate or demix mixtures of signals into their constituent components using no knowledge of the signals, provided the components are statistically independent.

The method of the present disclosure provides a dramatic improvement over the prior art in that the anomalies can be detected indirectly by first detecting and segmenting the primary components in data using ICA, and then taking advantage of the non-overlapping nature of the independent component outputs to find anomalies by forming image products from the outputs. If the demixing or separation process by ICA is 100% successful, then the products should be all zeros because the components do not overlap in data space. However, if any data subset is not demixed because the size of the subset is too small, then that data subset will be nonzero in some of the products because it will appear on multiple ICA outputs. Thus, the failure of ICA to demix anomalies can be used as an indicator to detect them. The ICA process is unable to demix the anomalies because, by definition, they consist of only a few or even one data element and do not provide sufficient statistics for ICA to estimate a demixing matrix. This makes the described process especially suitable for use on surveillance drones, robots, and satellites as well as smart cueing for human observers where the application is to find small objects over a large region.

As can be appreciated by those skilled in the art, the ICA anomaly detection according to the principles of the present invention has many applications. For example, this invention is applicable for surveillance from both manned and unmanned platforms for detection of vessels, drug smuggling boats and submersibles, planes, unmanned aerial vehicles (UAVs), floating wreckage, satellites, personnel, or any operation that involves searching for small possibly sub-pixel sized objects over wide areas that have color, spectral, or polarimetric properties, or any other measurable property, different from the background. By way of example, the system and method can be used for wide area surveillance for small objects that can be less than a pixel in size using any suitable platform (e.g., manned platforms, UAVs, satellites, or other platforms). By cueing other systems to small anomalous regions for confirmation, wide-area search and identification coverage rates can be increased by orders of magnitude. The ICA anomaly detection process automatically detects any visual anomaly as small as a single pixel with a color, spectral, or polarization distribution that differs from the predominant materials in the image. The described process does not require any prior training, learning, clustering, or a priori knowledge of the environment or expected anomalies. Further, the system and process adapt automatically to the scene on every frame, running at real-time rates since the processing time scales linearly with the number of pixels in the image. The system and process has only one adjustable parameter (a threshold setting) which can be adjusted to control the sensitivity vs selectivity trade-off, and can operate on images from existing color, multi-spectral, and polarimetric cameras or SAR imagers with no modifications to the sensors. The system and process is also parallelizable with linear speedups possible by subdividing the data and processing the divisions in parallel, since each division can be processed independently without information from other divisions. Finally, the false alarm rates are extremely low which is important for wide-area surveillance applications because to be detected the false alarms must occur at the same location in at least two ICA outputs. Further details are provided below.

(4) Specific Details of Various Embodiments

As noted above, this disclosure is directed to a system and method that uses independent component analysis (ICA) for detecting anomalous pixels in multi-color, multi-spectral, or multi-polarization image data that are different from the primary background materials. ICA is a well-known family of techniques for blindly separating mixtures of 1-D signals, e.g. without any prior knowledge of the signals or the mixing coefficients. ICA extracts the mixture components by maximizing various measures of the statistical independence of the output signals.

Figure 3:
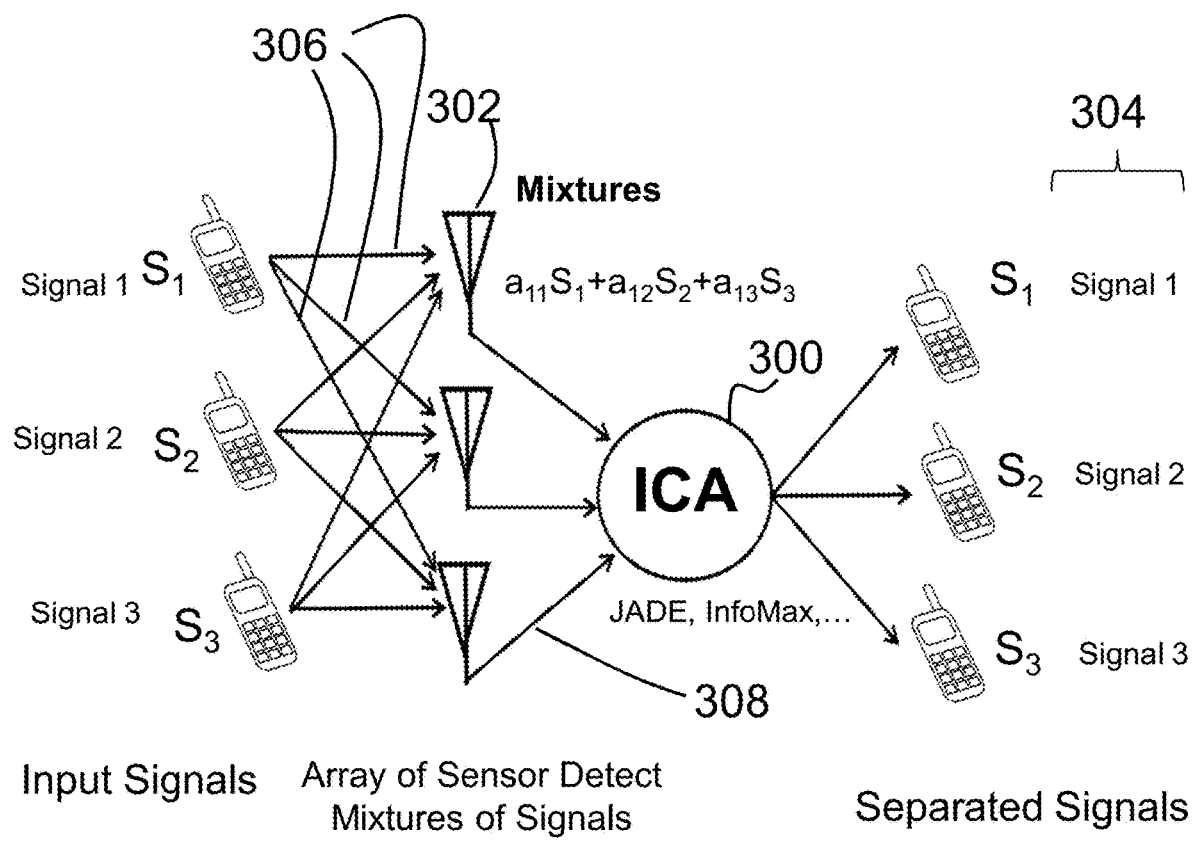
FIG. 3 is a flowchart depicting a process for separating a mixture of signals according to various embodiments of the present invention.

As shown in FIG. 3, ICA 300 can separate mixtures 302 of one-dimensional (1D) signals back into the original signals 304 without prior knowledge of the signals or the mixing coefficients by maximizing the statistical independence of the outputs. While the JADE implementation of ICA was used to generate the results shown here, other types of ICA or more general blind source separation methods can also be used. A detailed description of the JADE implementation as well as other forms of ICA can be found in a publication by S. Choi et al, "Blind source separation and independent component analysis: a review", Neural Information Processing Letters and Reviews, Vol. 6, No. 1, January 2005, which is incorporated herein by reference as though fully set forth herein. JADE is open source software in the Python language, and can be found github.com/camilleanne/pulse/blob/master/jade.py, the entirety of which is incorporated herein by reference.

The ICA process used herein can be used for a variety of signals and applications, including smart antennas and extraction of brain source signals from electroencephalography (EEG) data. Other non-limiting examples of applications in which the ICA can be used include the processes as described in U.S. Pat. No. 10,268,914, issued Apr. 23, 2019, entitled, "Blind Sensing for Hyperspectral Surveillance," U.S. Pat. No. 10,234,377, issued Mar. 19, 2019, entitled, "Fusion Of Independent Component Analysis And Sparse Representation-Based Classification For Analysis Of Spectral Data," U.S. Patent Publication No. 2019/0080210, published Mar. 14, 2019, entitled, "Independent Component Analysis of Tensors for Sensor Data Fusion and Reconstruction," and U.S. patent application Ser. No. 16/127,927, filed Sep. 11, 2018, entitled, "Mixed Domain Blind Source Separation for Sensor Array Processing," the entirety of which are incorporated herein by reference.

Figure 4:
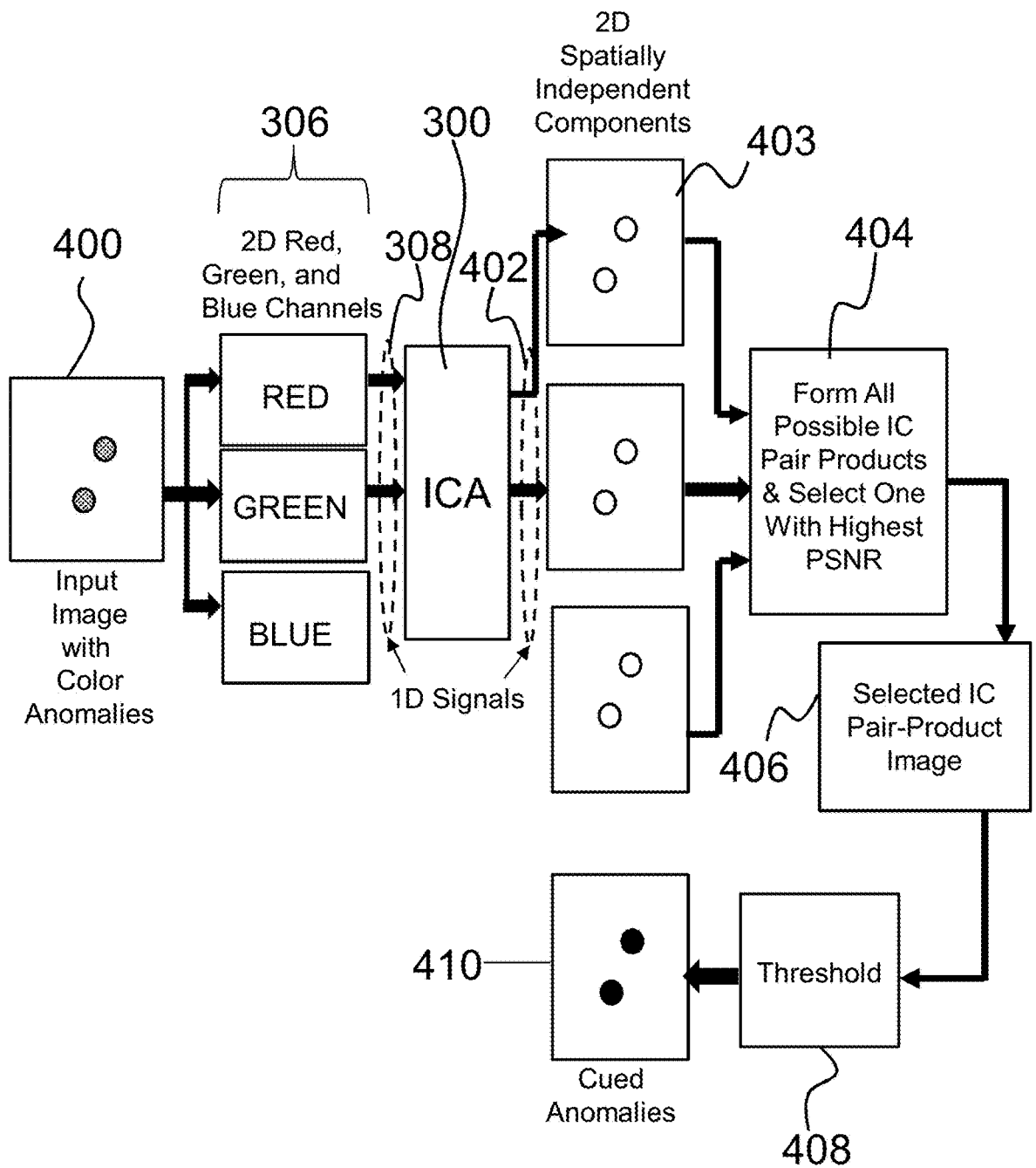
FIG. 4 is a flowchart depicting a process for detecting small objects with anomalous colors or spectral properties in images using independent component analysis (ICA) according to various embodiments of the present invention.

Importantly, the ICA process is used in the present system for detection of anomalies in color, multi-spectral, or polarimetric imagery. As shown in FIG. 3, each image channel 306 is reformatted into a 1D signal 308 by concatenating rows and treating the 1D signal as a mixture of image components for input to ICA 300. The process according to principles of the present invention improves upon the prior art and is depicted further FIG. 4. In FIG. 4, the input image 400 is an EO color image with three color channels that contains three randomly shaped primary components and two small anomalies that are colored differently (e.g., colored yellow, etc.) from the primary components. The two-dimensional (2D) red, green, and blue color channels 306 consist of different mixtures of the primary components and anomalies. After converting the 2D color channel mixture images 306 into 1D signals 308 by concatenating rows, the mixtures can be separated into 1D outputs 402 using ICA 300 and converted back into 2D output images 403. The 1D output 402 is converted back into 2D output images 403 by dividing the 1D output 402 into segments, each of which is the length of the rows in the input color channel images. The number of segments will be equal to the number of rows in the input color channel images. The segments for each ICA output are then stacked vertically to form the 2D output image for each ICA output. Each output image will have the same dimensions as the input images.

Since the primary components are well-represented in the input image 400, ICA 300 will have enough information to estimate statistics for demixing so the primary components will appear on different ICA outputs (i.e., 1D outputs 402) without spatially overlapping. This is not true for the anomalous pixels that do not belong to the primary components; therefore, the anomalies will appear in multiple ICA outputs. In other words, each primary region will appear in a separate ICA output 402 and will not overlap with the other primary regions. Therefore, products of the output images 403 will be low-valued everywhere, except where the anomalies occur since the anomalies will appear in multiple outputs and will spatially overlap.

Since the demixing will not be perfect due to limited data statistics and noise, the different products of different pairwise combinations of outputs will have different anomaly to background peak signal to noise ratios (PSNR). The top pair product with the largest PSNR is selected 404 for thresholding. This is done by first forming all possible N(N−1)/2 pair-wise product images that can be formed from the ICA outputs 402, where N is the number of ICA outputs. The independent component pair product image 406 with the highest PSNR is selected 404 for thresholding 408 in order to mark or cue 410 where the anomalies occur in the original multi-spectral input image 400. The top-ranking product image will have small bright peaks centered on the anomalies. The centers of the anomaly peaks that exceed the threshold value are used to determine the locations of the marks or cues.

This cueing 410 can be done without any prior knowledge or training. The algorithm will adapt automatically on a frame-by-frame basis to changing scenes imaged by color, multi-spectral, or hyper-spectral cameras. This invention can also be used for detection of anomalies in polarization, not just spectral properties, by using polarization channels generated using polarizing filters on a camera or using a polarimetric SAR image from a radar sensor. In addition, it can be used for any vector property that can be measured by a pixel.

A purpose of this invention is to detect anomalies using a wide field of view sensor which can be used for cueing pixels that can be subsequently examined by the cueing sensor by "zooming in" or magnifying the cued pixels or by examining them using a separate sensor in order to perform anomaly classification based on the spatial details of the anomaly. If a multi-spectral or hyper-spectral sensor is used for cueing, then the anomalies can also be classified based on their spectral properties.

ICA anomaly detection works best for images which consist primarily of n regions that are differentiated by color or spectral profile, where n is not greater than the number of color, spectral, or polarization channels. If n is greater than the number of channels, then some of the regions may not be separated spatially by ICA so they will not "cancel out" when the ICA output images are multiplied together. This will increase the number of false alarms, e.g. pixels incorrectly detected as anomalies when they are actually part of the background. Each of the primary regions should be large enough in total area to provide sufficient statistics for ICA to separate them; otherwise some of the regions may not be separated spatially by ICA so they will not "cancel out" when the ICA output images are multiplied together. The regions do not need to be connected or continuous and can be shaped arbitrarily. The anomalies should be small enough that ICA cannot separate them from the primary regions due to a lack of data. Alternatively, if the anomalies are large enough, then ICA will be able to separate them so they appear in only one output image which makes the anomaly be part of the background and no longer "anomalous". The color or spectral properties of the anomalies do not matter as long as they are different from the primary regions. The method is especially suitable for wide area surveillance of oceans, sky, space, and terrestrial regions with a limited number of different materials.

Another advantage of ICA anomaly detection is that as long as the spectral or polarimetric nature of the materials in the scene does not change, then the demixing matrix estimated from one frame of data can be used to demix subsequent frames without rerunning ICA. The spectral or polarimetric distribution of each input image frame can be measured and monitored. If the distribution hasn't changed, then the demixing matrix from the previous frame can be reused. Therefore, processing can be made extremely fast by only occasionally updating the demixing matrix when conditions change.

Figure 5:
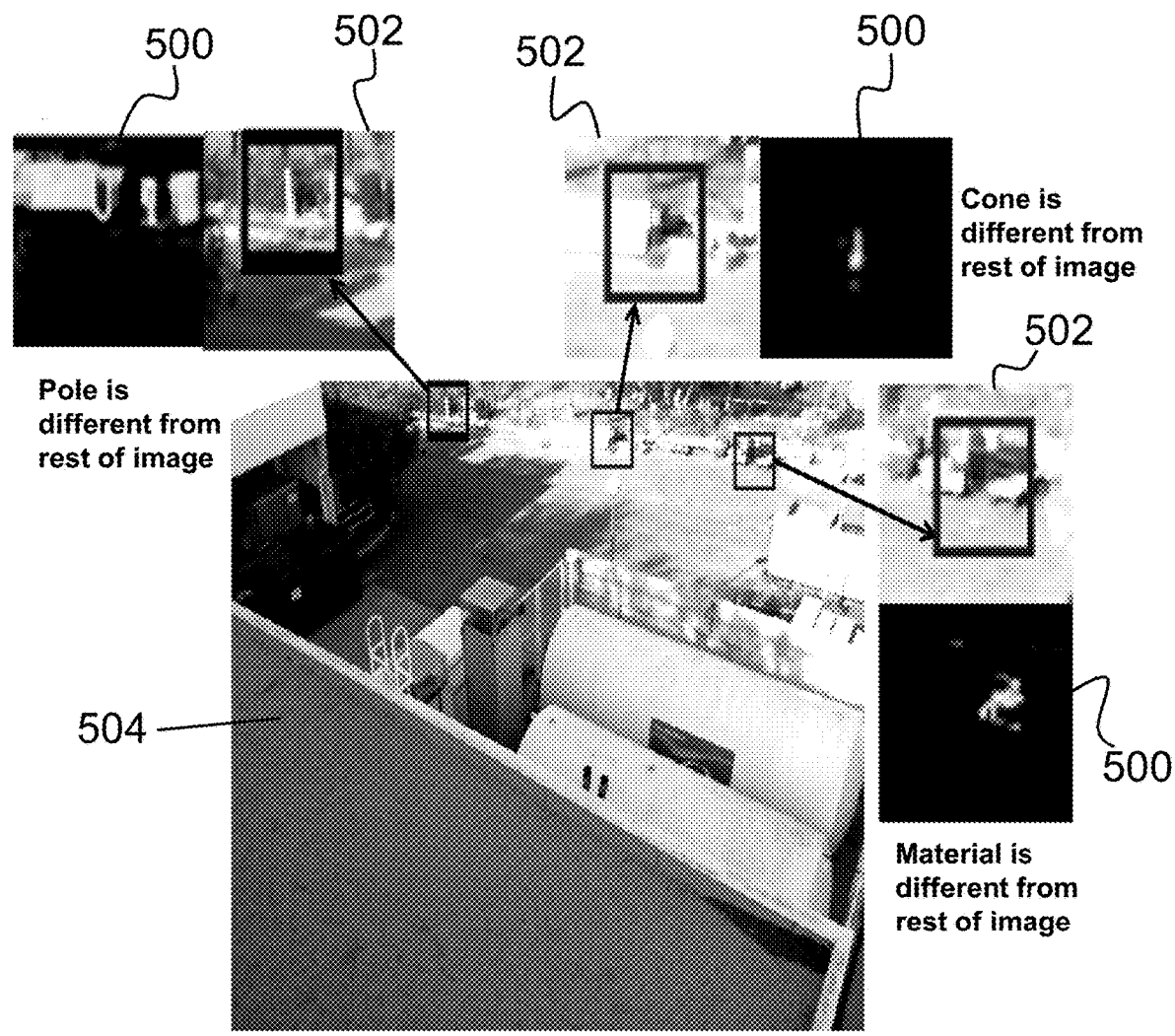
FIG. 5 is an illustration depicting an example of ICA anomaly heat maps and detections for an electrooptic (EO) color image according to various embodiments of the present invention.

Examples of ICA anomaly detection for a wide variety of color, multi-spectral, and polarimetric SAR images are shown in FIGS. 5 to 10. The method of this disclosure does not have any parameters to adjust, except for a single threshold level, which controls the sensitivity/selectivity trade-off. These results show that the method can adapt automatically to very different images without human guidance. More specifically, FIG. 5 is an example of ICA anomaly heat maps 500 and detections 502 for an EO color image 504. The method found 3 items colored differently from the rest of the scene. A heat map 500 is shown for each detected anomaly which displays how different the anomaly is using a color map that ranges from blue to green to red. In this example, no other anomalies were detected.

Figure 6:
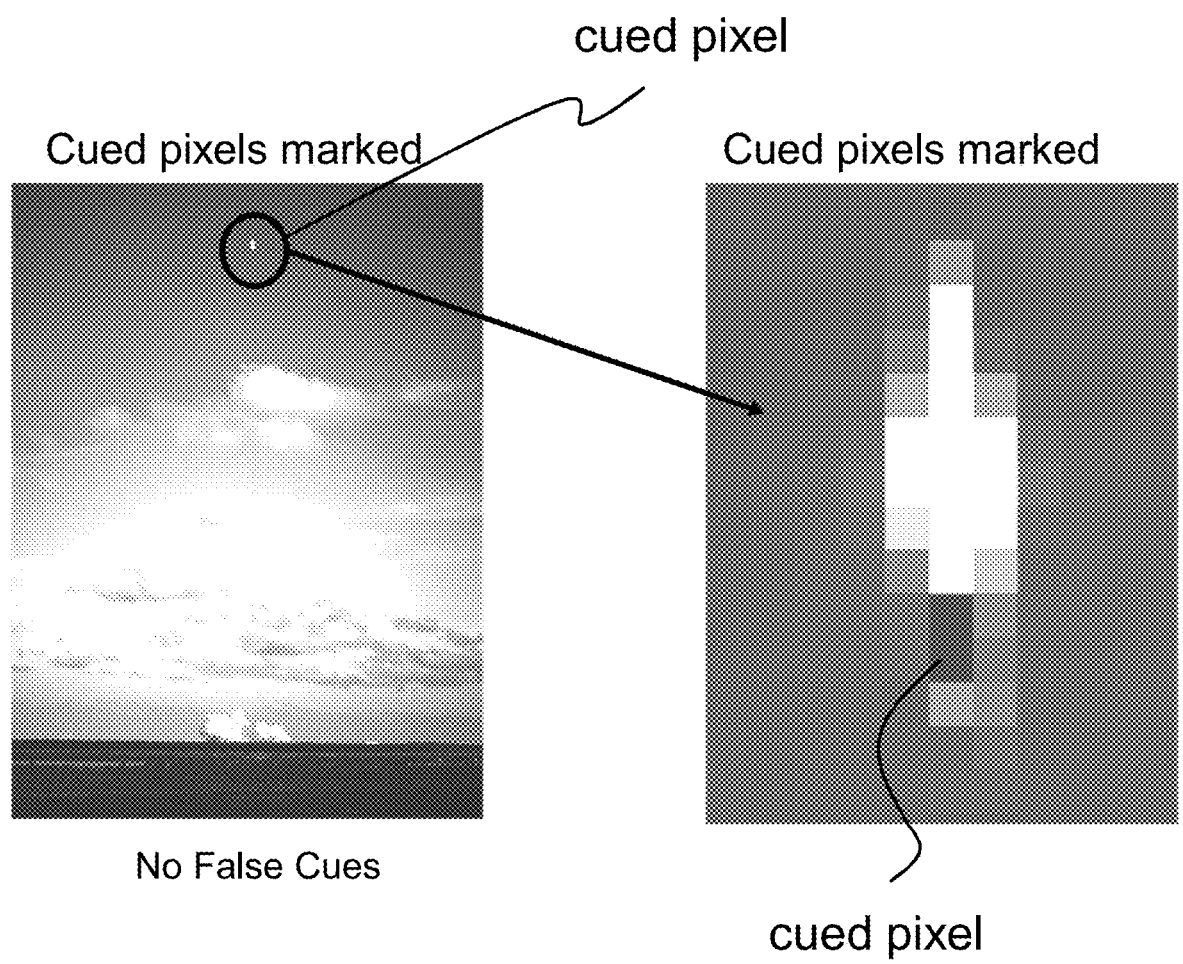
FIG. 6 is an illustration depicting an example of the ICA anomaly detection of a rocket plume only a single pixel in size in a color image according to various embodiments of the present invention.
Figure 7:
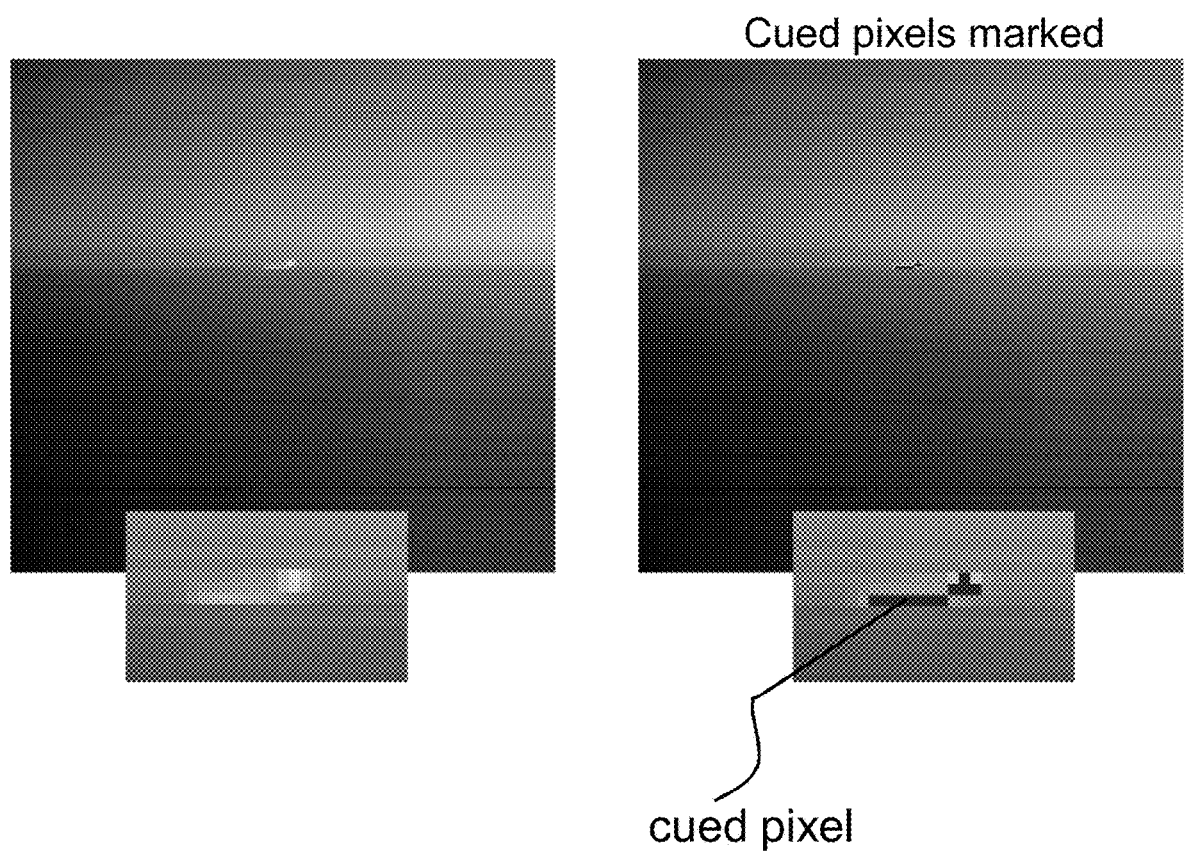
FIG. 7 is an illustration depicting an example of ICA anomaly detection of a ship only a few pixels in size in a multispectral (3-band) short-wave infrared (SWIR) image according to various embodiments of the present invention.

FIG. 6 is an example of ICA anomaly detection of a rocket plume only a single pixel in size in a color image. Anomalies are marked in red. No other anomalies were detected. For further illustration, FIG. 7 is an example of ICA anomaly detection of a ship only a few pixels in size in a multispectral (3-band) Short Wave Infrared (SWIR) image. As was the case above, the anomalies are marked in red and no other anomalies were detected.

Figure 8:
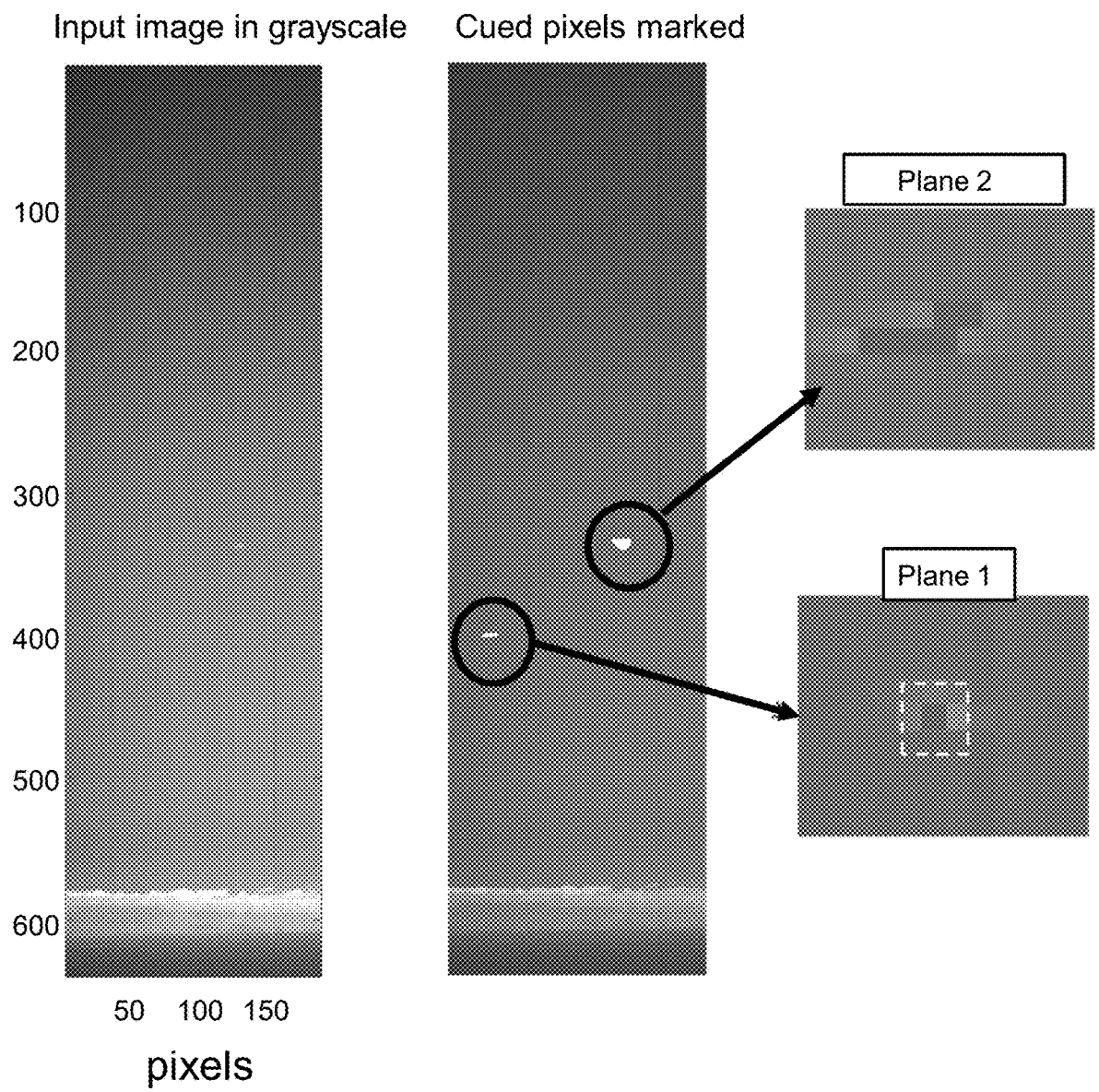
FIG. 8 is an illustration depicting an example of ICA anomaly detection of low contrast airplanes only a few pixels in size in a SWIR multi-spectral (3-band) image according to various embodiments of the present invention.

FIG. 8 is an example of ICA anomaly detection of low contrast airplanes only a few pixels in size in a SWIR multi-spectral (3-band) image. Again, the anomalies are marked in red and no other anomalies were detected. Processing time for this 640×190 pixel image was 0.046 sec in Matlab on a personal computer.

Figure 9:
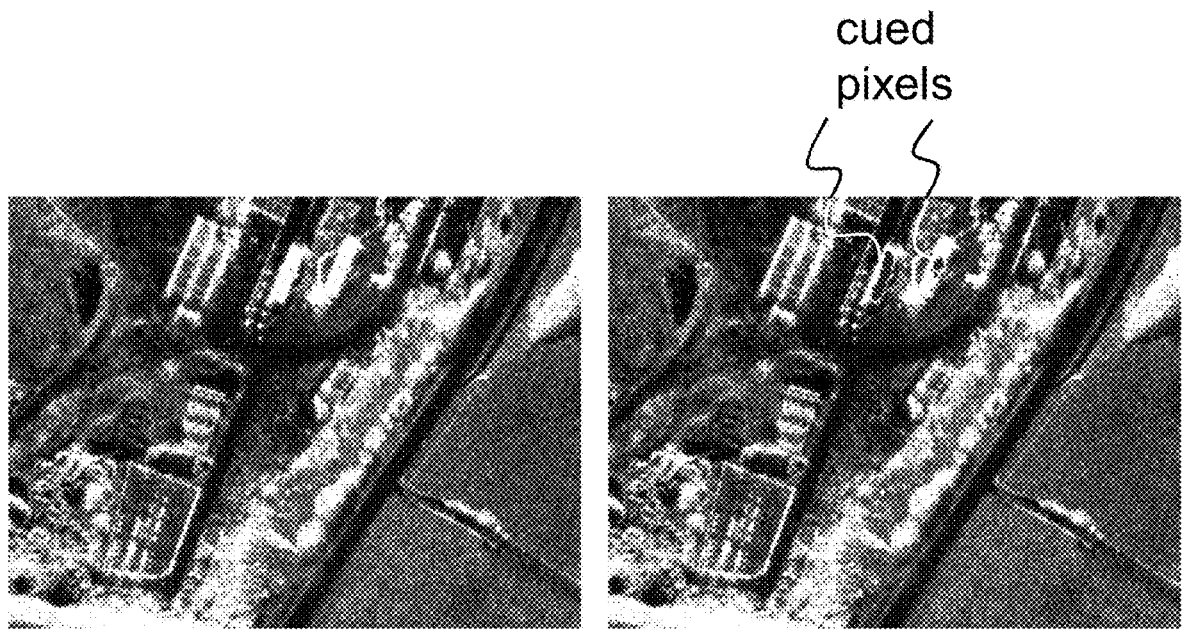
FIG. 9 is an illustration depicting an example of ICA anomaly detection for polarimetric synthetic aperture radar (SAR) data in which the polarization of a radar pixel is represented by color according to various embodiments of the present invention.
Figure 10:
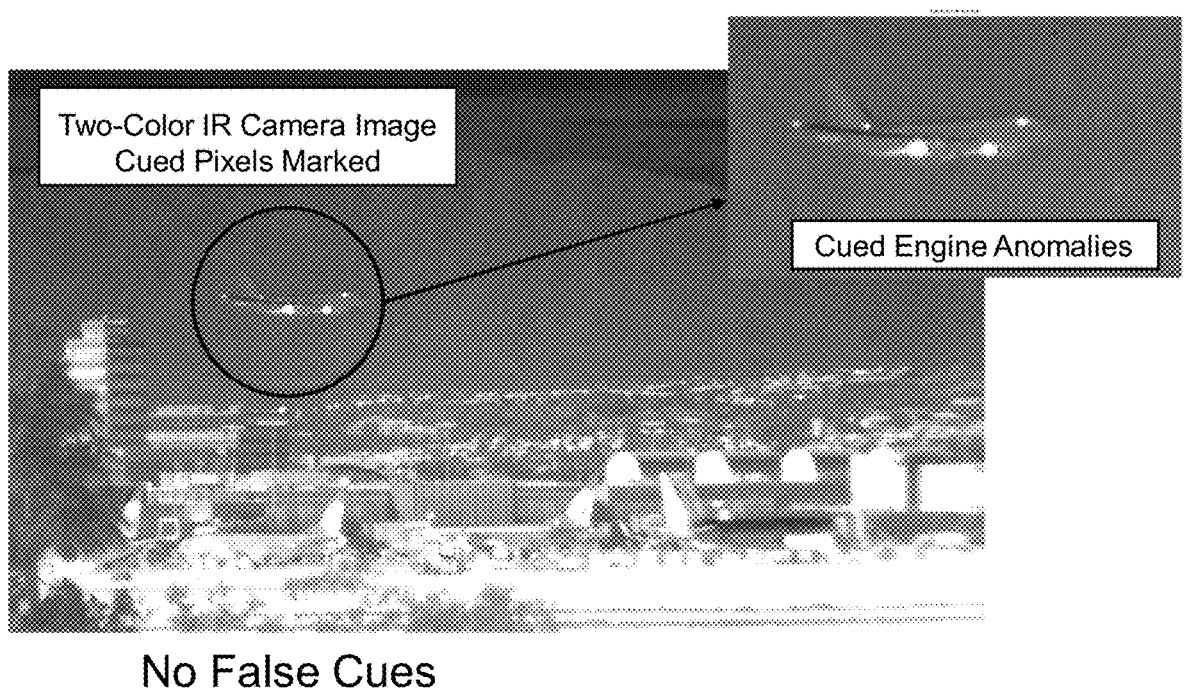
FIG. 10 is an illustration depicting an example of ICA anomaly detection for two-color infrared (IR) data according to various embodiments of the present invention.

FIG. 9 is an example of ICA anomaly detection for polarimetric SAR data. The polarization of each pixel was mapped to colors before processing with ICA. Anomalies are marked in red. The method found roofs with polarization different from other locations in the data. No other anomalies were detected. Processing time for this 1872×2442 pixel image was 1.34 sec in Matlab on a PC. (Only a small section of the output image is shown). Finally, FIG. 10 is an example of ICA anomaly detection for two-color infrared (IR) data. The method used in this example found anomalies near the engine intakes (indicated by the large white spots on the engines) with IR "colors" different from the rest of the image. No other anomalies were detected. Processing time for this 736×1280 pixel image was 0.16 sec in Matlab on a PC.

(4.1) Control of a Device

Figure 11:
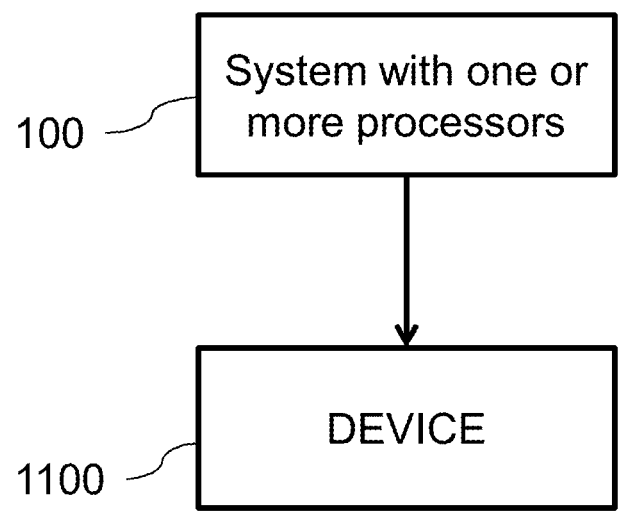
FIG. 11 is a flowchart depicting a system controlling a device according to various embodiments of the present invention.

As shown in FIG. 11, the system 100 of the present disclosure may be used to control a device 1100 (e.g., an autonomous platform such as a UAV, vehicle, etc., or any other suitable device) based on identifying an anomaly in an input image (which corresponds to an location input image and corresponding scenery). In various embodiments, the device 1100 may be controlled to cause the device to move or otherwise initiate a physical action based on the identification.

In some embodiments, a mobile platform, such as a drone, autonomous vehicle, or rotatable camera, may be controlled to move or focus on an area where the object is determined to be based on the imagery. For example, a camera may be controlled to orient towards the localization or location of the object. In other words, actuators or motors are activated to cause the camera (or sensor) to move and/or zoom in on the location where the object is localized. In yet another aspect, if a system is seeking a particular object and if the object is not determined to be within the field-of-view of the camera after the process, the camera can be caused to rotate or turn to view other areas within a scene until the sought after object is detected.

As yet another example, an autonomous vehicle can be fitted with multiple sensors, such as cameras. If the autonomous vehicle determines that an object is within a pathway that the vehicle is traversing, the system can cause the autonomous vehicle to perform a vehicle operation, such as a braking or turning maneuver to avoid a collision. As yet another example, if the object is a stop sign, the system may cause the autonomous vehicle to apply a functional response, such as a braking operation, to stop the vehicle. Other appropriate responses may include one or more of a steering operation, a throttle operation to increase speed or to decrease speed, or a decision to maintain course and speed without change. The responses may be appropriate for avoiding a collision, improving travel speed, or improving efficiency.

Thus, FIG. 11 is a flow diagram illustrating using the system 100 to control a device 1100 based on cueing of the anomaly and the resulting identification.

Non-limiting examples of devices 1100 that can be controlled via the system 100 include a vehicle or a vehicle component, such as a brake, a steering mechanism, suspension, or safety device (e.g., airbags, seatbelt tensioners, etc.). Further, the vehicle could be an unmanned aerial vehicle (UAV), an autonomous ground vehicle, or a human operated vehicle controlled either by a driver or by a remote operator. As can be appreciated by one skilled in the art, control of other device types is also possible.

Finally, while this invention has been described in terms of several embodiments, one of ordinary skill in the art will readily recognize that the invention may have other applications in other environments. It should be noted that many embodiments and implementations are possible. Further, the following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". Further, while particular method steps have been recited in a particular order, the method steps may occur in any desired order and fall within the scope of the present invention.

What is claimed is:

1. A system for anomaly detection using anomaly cueing, the system comprising:
   one or more processors and a memory, the memory being a non-transitory computer-readable medium having executable instructions encoded thereon, such that upon execution of the instructions, the one or more processors perform operations of:
   receiving an input image having two-dimensional (2D) image mixtures of primary components;
   reformatting the 2D image mixtures into one-dimensional (1D) input signals;
   using blind source signal separation, separating the 1D input signals into separate output primary components, the separate output primary components being 1D output signals;
   reforming the 1D output signals into 2D spatially independent component output images;
   calculating all possible pair product images of the 2D spatially independent component output images and corresponding signal-to-noise ratios;
   selecting a pair product image based on the signal-to-noise ratio; and
   thresholding the selected pair product image to identify anomalies in the pair product image.

2. The system as set forth in claim 1, further comprising an operation of controlling a device based on the anomalies.

3. The system as set forth in claim 1, further comprising an operation of monitoring image statistics of a next image frame to determine if the 2D image mixtures of primary components have changed from those of the input image, such that if the 2D image mixtures of primary components have not changed, then reusing a demixing matrix from a previous frame to demix the next image frame, otherwise performing anomaly detection on the next image frame to identify anomalies on the next image frame.

4. The system as set forth in claim 1, further comprising an operation of using a subset of the input image to calculate a demixing matrix and then using the demixing matrix to demix the input image based on the subset of the input image.

5. The system as set forth in claim 1, wherein the 2D image mixtures are formed of color, spectral, or polarimetric channels of image data.

6. The system as set forth in claim 1, wherein the blind source signal separation is independent component analysis.

7. The system as set forth in claim 1, wherein the 2D image mixtures are reformatted into 1D input signals by concatenating rows and treating the 1D input signal as a mixture of image components for input to the blind source signal separation.

8. The system as set forth in claim 1, where the pair product images having dimensions matching the input image such that locations of anomalies in the pair product images correspond directly to locations in the input image.

9. A computer implemented method for anomaly detection using anomaly cueing, the method comprising an act of:
   causing one or more processors to execute instructions encoded on a non-transitory computer-readable medium, such that upon execution, the one or more processors perform operations of:
   receiving an input image having two-dimensional (2D) image mixtures of primary components;
   reformatting the 2D image mixtures into one-dimensional (1D) input signals;
   using blind source signal separation, separating the 1D input signals into separate output primary components, the separate output primary components being 1D output signals;
   reforming the 1D output signals into 2D spatially independent component output images;
   calculating all possible pair product images of the 2D spatially independent component output images and corresponding signal-to-noise ratios;
   selecting a pair product image based on the signal-to-noise ratio; and
   thresholding the selected pair product image to identify anomalies in the pair product image.

10. The method as set forth in claim 9, further comprising an operation of controlling a device based on the anomalies.

11. The method as set forth in claim 9, further comprising an operation of monitoring image statistics of a next image frame to determine if the 2D image mixtures of primary components have changed from those of the input image, such that if the 2D image mixtures of primary components have not changed, then reusing a demixing matrix from a previous frame to demix the next image frame, otherwise performing anomaly detection on the next image frame to identify anomalies on the next image frame.

12. The method as set forth in claim 9, further comprising an operation of using a subset of the input image to calculate a demixing matrix and then using the demixing matrix to demix the input image based on the subset of the input image.

13. The method as set forth in claim 9, wherein the 2D image mixtures are formed of color, spectral, or polarimetric channels of image data.

14. The method as set forth in claim 9, wherein the blind source signal separation is independent component analysis.

15. The method as set forth in claim 9, wherein the 2D image mixtures are reformatted into 1D input signals by concatenating rows and treating the 1D input signal as a mixture of image components for input to the blind source signal separation.

16. The method as set forth in claim 9, where the pair product images having dimensions matching the input image such that locations of anomalies in the pair product images correspond directly to locations in the input image.

17. A computer program product for anomaly detection using anomaly cueing, the computer program product comprising:
- a non-transitory computer-readable medium having executable instructions encoded thereon, such that upon execution of the instructions by one or more processors, the one or more processors perform operations of:
  - receiving an input image having two-dimensional (2D) image mixtures of primary components;
  - reformatting the 2D image mixtures into one-dimensional (1D) input signals;
  - using blind source signal separation, separating the 1D input signals into separate output primary components, the separate output primary components being 1D output signals;
  - reforming the 1D output signals into 2D spatially independent component output images;
  - calculating all possible pair product images of the 2D spatially independent component output images and corresponding signal-to-noise ratios;
  - selecting a pair product image based on the signal-to-noise ratio; and
  - thresholding the selected pair product image to identify anomalies in the pair product image.

18. The computer program product as set forth in claim 17, further comprising an operation of controlling a device based on the anomalies.

19. The computer program product as set forth in claim 17, further comprising an operation of monitoring image statistics of a next image frame to determine if the 2D image mixtures of primary components have changed from those of the input image, such that if the 2D image mixtures of primary components have not changed, then reusing a demixing matrix from a previous frame to demix the next image frame, otherwise performing anomaly detection on the next image frame to identify anomalies on the next image frame.

20. The computer program product as set forth in claim 17, further comprising an operation of using a subset of the input image to calculate a demixing matrix and then using the demixing matrix to demix the input image based on the subset of the input image.

21. The computer program product as set forth in claim 17, wherein the 2D image mixtures are formed of color, spectral, or polarimetric channels of image data.

22. The computer program product as set forth in claim 17, wherein the blind source signal separation is independent component analysis.

23. The computer program product as set forth in claim 17, wherein the 2D image mixtures are reformatted into 1D input signals by concatenating rows and treating the 1D input signal as a mixture of image components for input to the blind source signal separation.

24. The computer program product as set forth in claim 17, where the pair product images having dimensions matching the input image such that locations of anomalies in the pair product images correspond directly to locations in the input image.

\* \* \* \* \*